United States Patent [19]
Hashimoto

[11] Patent Number: 5,880,817
[45] Date of Patent: Mar. 9, 1999

[54] PROJECTION-EXPOSURE APPARATUS AND METHOD EXHIBITING REDUCED SOLARIZATION AND RADIATION COMPACTION

[75] Inventor: Sumio Hashimoto, Yokohama, Japan

[73] Assignee: Nikon Corporation, Tokyo, Japan

[21] Appl. No.: 760,871

[22] Filed: Dec. 9, 1996

[30] Foreign Application Priority Data

Dec. 12, 1995 [JP] Japan .................................. 7-322920

[51] Int. Cl.⁶ .................................................. G03B 27/42
[52] U.S. Cl. ............................... 355/53; 355/70; 355/71
[58] Field of Search ............................... 355/53, 67, 70, 355/71

[56] References Cited

U.S. PATENT DOCUMENTS

| | | | |
|---|---|---|---|
| 4,970,546 | 11/1990 | Suzuki et al. | 355/53 |
| 5,091,744 | 2/1992 | Omata | 355/53 |
| 5,300,971 | 4/1994 | Kudo | 355/53 X |
| 5,677,754 | 10/1997 | Makinouchi | 355/53 |

FOREIGN PATENT DOCUMENTS 61-097831  5/1986  Japan .

OTHER PUBLICATIONS

Rothschild, et al., "Effects of Excimer Laser Irradiation on the Transmission, Index of Refraction, and Density of Ultra-–Violet Grade Fused Silica," *Appl. Phys. Lett.* 55:1276–1278 (1989).

*Primary Examiner*—Fred L. Braun
*Attorney, Agent, or Firm*—Klarquist Sparkman Campbell Leigh & Whinston, LLP

[57] ABSTRACT

Apparatus and methods for suppressing degradations in the transmissivity and refractive index of lenses used in an exposure unit of a projection-exposure apparatus in which a high-energy pulsed beam of light (such as an excimer laser) is used for the projection exposure. Pulsed-light beams from multiple pulsed-light sources are provided, the pulsed-light beams each having the same wavelength, pulse frequency $P_0$, and fluence $F_0$ but being phase-shifted relative to each other. The pulsed-light beams are each split by a beam splitter and integrated to produce at least one integrated light beam having a pulse frequency of $P_0$ times the number of pulsed-light beams that are integrated but a fluence per pulse of $F_0$ divided by the number of pulsed-light beams that are integrated. The integrated light beam is passed through the exposure unit. Multiple such integrated light beams can be produced, each propagating to a separate exposure unit.

20 Claims, 4 Drawing Sheets

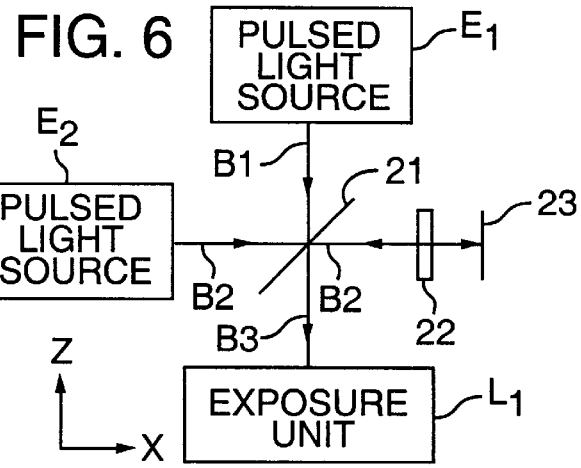

PROJECTION-EXPOSURE APPARATUS AND METHOD EXHIBITING REDUCED SOLARIZATION AND RADIATION COMPACTION

FIELD OF THE INVENTION

This invention pertains to projection-exposure apparatus, especially as used in microlithography processes to manufacture, e.g., semiconductor devices, liquid-crystal displays, image pick-up elements (CCD, etc.), thin-film magnetic heads, etc. More specifically, the invention is directed to such apparatus in which a pulsed light source, such as a KrF or ArF excimer laser, is used as the exposure illumination light source.

BACKGROUND OF THE INVENTION

Various projection-exposure apparatus are known such as steppers and the like. Such apparatus are typically used in microlithography processes for the manufacture of, e.g., semiconductor devices, and involve the transfer by projection of a pattern defined on a reticle (also termed a "photomask" or simply "mask") onto a suitable substrate, such as a silicon wafer or glass plate, having a photosensitive surface. Production of devices having ever greater feature density has required a corresponding increase in the projection resolution obtainable with such apparatus.

Some increased projection resolution has been achieved by use of increasingly shorter wavelengths of illumination light. Most current projection-exposure apparatus employ 365-nm i-line light generated by a high-pressure mercury lamp. Recently, excimer lasers have become more favored because of their high intensity and short wavelengths of light. For example, a KrF excimer laser produces 248-nm light, which is in the far ultraviolet range and has a substantially shorter wavelength than i-line light. Also, the ArF excimer laser (193 nm) is receiving greater attention as an illumination source.

As an alternative to excimer lasers, it is also possible to use a harmonic metallic vapor laser (e.g., copper-vapor laser) or a YAG laser, for example, to generate short-wavelength illumination light in the ultraviolet range. The fact that such lasers, as well as excimer lasers, are pulse lasers poses certain technical challenges.

Projection-exposure apparatus employ a projection lens to refract light passing through the reticle onto the surface of the substrate. Such projection lenses as used to refract ultraviolet light must have a high transmissivity to the light. The glass used to make such lenses is currently limited to quartz and fluorite.

When light from an excimer laser, especially from an ArF excimer laser, is used as the exposure illumination light, serious problems have been encountered in prior-art projection-exposure apparatus. As stated above, excimer lasers are pulsed. The pulses typically have a very rapid rise time, e.g., several nsec, at a frequency range of 600 to 1000 Hz. Consequently, the amount of energy per pulse required to obtain an exposure energy per unit time that is equivalent to the exposure energy produced by a source that generates continuous illumination is extremely large if throughput is to be maintained. The great and rapid change in instantaneous energy of such pulsed laser light has been found to cause a phenomenon called "solarization" of the projection lens. Solarization results in a lowering of the transmissivity of the incident area of the lens, even in lenses made of quartz. The extent of the decrease in transmissivity is proportional to the square of the light "fluence," wherein the fluence is the irradiation energy density per pulse of light $[mJ/(cm^2 \cdot pulse)]$.

In addition, exposure to high-intensity pulsed ultraviolet light will cause quartz to experience, in the incidence area, a phenomenon called "radiation compaction." Radiation compaction causes the refractive index to increase at a rate proportional to the square of the fluence. In one example in which KrF excimer laser light was used with a quartz lens in which the fluence was 1 $mJ/(cm^2 \cdot pulse)$, the increase in refractive index after $10^{10}$ pulses was approximately $5 \times 10^{-7}$. The rate of radiation compaction is a function of wavelength. A similar exposure of quartz to an ArF excimer laser causes an increase in refractive index from radiation compaction that is approximately two orders of magnitude greater than when the quartz is exposed to a KrF excimer laser.

Radiation compaction can seriously degrade the ability of a projection lens to correct aberrations. In addition, solarization causes a lens to absorb more of the light irradiation energy as heat. Such localized heating can cause significant thermal deformations of the lens, thereby increasing aberrations. Such heating can also increase the refractive index of the lens, which can also increase aberrations.

It is known that solarization and radiation compaction can be lessened by increasing the pulse frequency of the illumination light and correspondingly lowering the light energy per pulse. For example, doubling the pulse frequency allows the light energy per pulse to be halved while obtaining the same throughput (number of wafers processed per unit time using the projection-exposure apparatus). That is, doubling the pulse frequency of the illumination light allows the fluence (F) to be halved.

More specifically, the number of illumination-light pulses per unit time (i.e., pulse frequency) is denoted by P. Both the solarization and radiation compaction are proportional to $P \cdot F^2$. Thus, with respect to an initial fluence of $F_0$ and an initial pulse frequency of $P_0$, changes in transmissivity and refractive index of a projection lens due to solarization and radiation compaction can be halved by doubling $P_0$ and halving $F_0$:

$$F^2 \cdot P = (F_0/2)^2 (2P_0) = F_0^2 (P_0/2)$$

In other words, at the same throughput, the effects of solarization and radiation compaction of a projection lens can be reduced in inverse proportion to a change in the pulse frequency.

Incidentally, fluorine gas ($F_2$) used as the laser gas in a pulse-emitting excimer laser contains various impurities, such as oxygen ($O_2$) and nitrogen ($N_2$), carbon tetrafluoride ($CF_4$), hydrogen fluoride (HF), and silicon tetrafluoride ($SiF_4$), as well as carbon (C), nitrogen dioxide ($NO_2$), and various fluorine compounds created by electrical discharge. These impurity compounds degrade the laser gas and thus decrease laser output; the impurities also absorb laser light and contribute to fouling of the transmission window in the laser. Consequently, modern excimer lasers provide for rapid exhaust of any contaminated laser gas at each pulse.

In general, an increase in the pulse frequency of light produced by an excimer laser requires a corresponding increase in the rate of the laser's exhaust mechanism. For example, in order to double the pulse frequency of light from an excimer laser, the laser-gas exhaust mechanism must be able to operate at double normal speed, a further increase in pulse frequency would require a correspondingly further increase in the speed of the exhaust mechanism. However, with current technology, there is a limit on the speed at which conventional excimer-laser exhaust mechanisms can operate (about 1 kHz). This imposes a limit on the pulse frequency of illumination light obtainable with conventional projection-exposure equipment.

SUMMARY OF THE INVENTION

The present invention resolves the foregoing problems in the prior art. An object of the invention is to provide a projection-exposure apparatus exhibiting a substantially lower propensity to undergo changes in the transmissivity and refractive index of lens elements used in the apparatus for refracting illumination light, even when the illumination light source is pulsatile and it is difficult to increase the pulse frequency of the illumination light beyond a certain limit.

According to a preferred embodiment, a projection-exposure apparatus is provided that is operable to transfer a mask pattern onto a photosensitive substrate using a pulsed illumination light. The illumination light is produced using multiple individual pulsed-light sources (such as individual excimer lasers). Each pulsed-light source is controlled to emit pulses of light at different instances of time relative to the other pulsed-light sources (i.e., the pulsed-light sources are all "phase-shifted" relative to each other.) As a result, none of the light pulses overlaps another light pulse. The apparatus further comprises an integration optical system operable to integrate illumination-light pulses from the multiple pulsed-light sources and form therefrom a single pulse train of illumination light. The apparatus also preferably comprises at least one exposure unit operable to direct an integrated illumination-light flux through a reticle onto a photosensitive substrate (such as a wafer). Typically, each such exposure unit comprises a projection lens.

The pulse frequency of the integrated illumination light is higher than that of any of the pulsed-light sources in proportion to the number of pulsed-light sources producing light that is integrated. At a particular level of cumulative irradiation energy required to make a single exposure on the substrate, the amount of irradiation energy per pulse in an apparatus according to the present invention can be decreased in inverse proportion to the number of pulsed-light sources producing light that is integrated into the irradiation energy.

As discussed above, as the pulse energy of illumination light increases, changes in transmissivity and the refractive index of the projection lens refracting such light become more pronounced due to solarization and radiation compaction. The magnitude of such changes is proportional to the irradiation-energy density of the illumination light passing through the lens, i.e., to the fluence F squared, and to the pulse frequency P. Apparatus according to the present invention allow the number of pulses P to be increased in proportion to, and the fluence F to be decreased in inverse proportion to, the number of pulsed-light sources employed to produce the illumination light. I.e., if the number of pulsed-light sources is n, the initial fluence is $F_0$, and the initial pulse frequency is $P_0$, adverse changes to the projection lens due to solarization and radiation compaction are decreased by $1/n$:

$$F^2 \cdot P = (F_0/n)^2 (nP_0) = (1/n) F_0^2 \cdot P_0$$

Consequently, with the present invention, even when pulsed illumination-light sources, such as KrF or ArF excimer lasers, are used for projection exposure, changes in transmissivity and refractive index in the projection lens can be greatly suppressed compared to the prior art.

An apparatus according to the present invention preferably comprises a pulse-propagation controller operable to control the timing of the various light pulses emitted from the multiple pulsed-light sources. Such timing control makes uniform the period between successive pulses in the illumination light flux propagating through the projection lens.

According to another aspect of the invention, a projection-exposure apparatus is provided that comprises multiple exposure units. Each exposure unit comprises an exposure lens and is operable to transfer a separate mask pattern onto a separate photosensitive substrate. One or more beam splitters can be used to integrate pulse trains of illumination light from pulsed-light sources and for integrated pulse trains of illumination light flux that are propagated to each exposure unit.

The foregoing and additional features and advantages of the present invention will be more readily apparent from the following detailed description, which proceeds with reference to the accompanying drawings.

BRIEF DESCRIPTION OF THE DRAWINGS

FIGS. 5(a) and 5(c) show a representative illumination-light pulse-timing scheme for the FIG. 2 embodiment.

FIG. 6 is a schematic diagram of an alternative embodiment to the FIG. 1 embodiment.

FIGS. 7(a) and 7(b) are a schematic diagram showing structural features of yet another alternative embodiment employing four off-axis pulsed-light sources.

DETAILED DESCRIPTION

Figure 1:
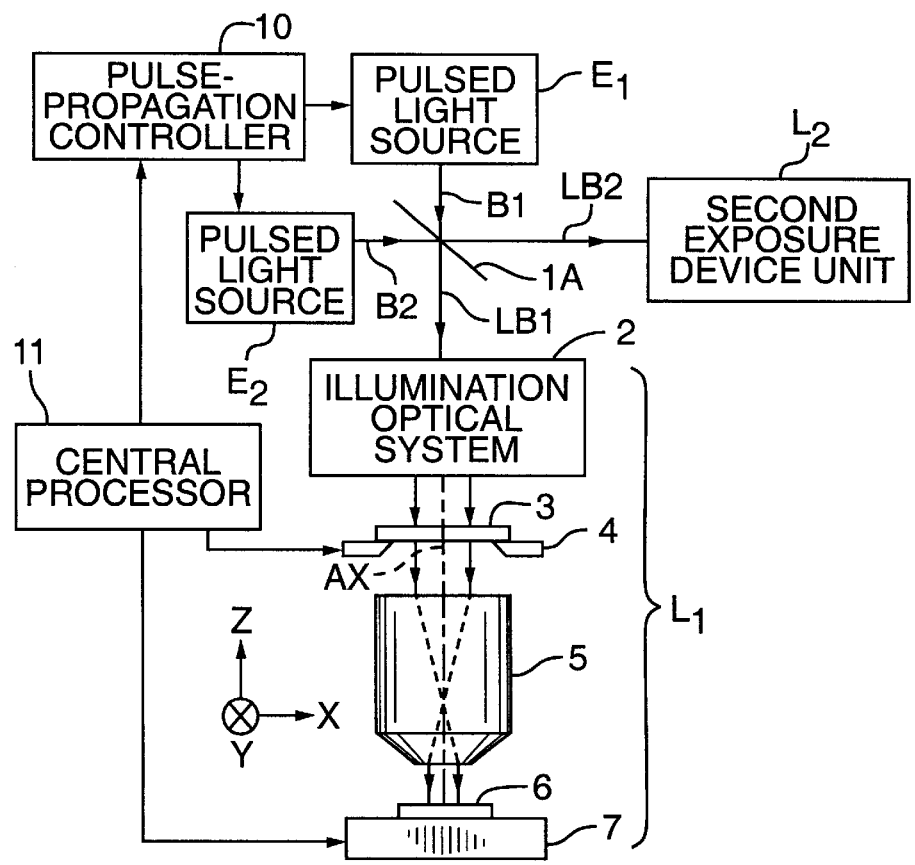
FIG. 1 is a schematic elevational view of an example embodiment of a projection-exposure apparatus according to the present invention employing two pulsed-light sources.

A first example embodiment of a projection-exposure apparatus according to the present invention is shown in FIG. 1. The FIG. 1 embodiment can be used as a "stepper" operable to expose a pattern, defined by a reticle, onto a respective "transfer field" on a wafer through a projection lens.

In FIG. 1, a first pulsed-light source $E_1$ and a second pulsed-light source $E_2$ are used to provide illumination light for projection exposure. The pulsed-light sources $E_1$, $E_2$ are preferably of the same type, and are preferably lasers. Each pulsed-light source $E_1$, $E_2$ generates a pulsed-light beam B1, B2, respectively, preferably having the same wavelength and pulse frequency. By way of example, the first and second pulsed-light sources $E_1$, $E_2$ can each be an ArF excimer laser. Alternatively, other excimer lasers can be used, such as KrF excimer lasers, as well as harmonic propagation devices for copper-vapor laser light sources or YAG lasers, etc.

Coordinated release of pulse trains of illumination light by the pulsed-light sources $E_1$, $E_2$ is regulated by a pulse-propagation controller 10. A central processor 11 generally controls operation of the overall apparatus including the pulse-propagation controller 10. Thus, each of the pulsed-light sources $E_1$, $E_2$ emits a pulse train of illumination light in which the pulses do not occur at the same instances of time as the pulses in the other pulse train of illumination light. Such control is facilitated by the results of irradiance measurements at the wafer ensuring that the intensities of the light pulses are essentially equal.

The pulsed-light beams B1 and B2 emitted from the pulsed-light sources $E_1$, $E_2$, respectively, enter a beam splitter 1A from orthogonal (perpendicular) directions. The beam splitter 1A allows about half the light energy in each pulsed-light beam to pass therethrough and reflects the other half. As a result, two integrated light beams LB1, LB2, are formed. Each integrated light beam carries essentially half the energy of pulsed-light beam B1 and essentially half the energy of pulsed-light beam B2. The integrated light beams LB1, LB2 exit from the beam splitter 1A in orthogonal directions.

The integrated light beam LB1 illuminates a reticle 3 via an illumination optical system 2. The illumination optical system 2 preferably comprises the following components (not shown in FIG. 1): (a) a beam-shaper serving to define the cross-sectional profile of the beam LB1, (b) an extinction filter operable to adjust the intensity of the beam in several stages, (c) a fly-eye lens or analogous element serving to make essentially uniform the irradiance distribution on the reticle, (d) a field aperture, (e) a relay lens, and (f) a condenser lens. Using the integrated light beam LB1 as an exposure illumination light, an image of the pattern defined by the reticle 3 is projected via a projection lens 5 onto the surface of a "wafer" 6.

In the following description, the Z axis is regarded as parallel with the optical axis AX of the projection lens 5. The X and Y axes define a plane to which the optical axis AX is normal. In FIG. 1, the X axis is parallel with the surface of the page and the Y axis is perpendicular to the surface of the page.

Further with respect to FIG. 1, the reticle 3 is mounted on a reticle stage 4 operable to position the reticle 3 in the X and Y dimensions, and to allow limited rotation (θ) of the reticle about the optical axis AX or about an axis parallel to the optical axis AX.

The wafer 6 is mounted on a wafer stage 7 via a conventional wafer holder (not shown). The wafer stage 7 is operable to position the wafer 6 in the X and Y dimensions, and allows limited rotation (θ) of the wafer about the optical axis AX or about an axis parallel to the optical axis AX. The wafer stage 7 is also operable to adjust the position of the wafer 6 in the Z dimension (focal dimension). A conventional focal-position detection system (not shown) detects the focal position of the wafer 6, and various conventional alignment systems (not shown) are preferably included in the apparatus for aligning the reticle 3 and the wafer 6 relative to each other and to the projection lens 5.

In the following description, the portion of the apparatus as shown in FIG. 1 from the illumination optical system 2 to the wafer stage 7, including the associated focal-position detection system and alignment systems, is regarded as a first exposure unit $L_1$. The apparatus of FIG. 1 also comprises a second exposure unit $L_2$, identical to the first exposure unit $L_1$ but indicated by a box. The integrated light beam LB2 is utilized as an exposure illumination light by the second exposure device unit $L_2$. Also, the beam splitter 1A is situated such that its reflective surfaces are at essentially 45° inclination relative to incident light beams.

With respect to operation of the FIG. 1 embodiment, two individual pulsed-light sources $E_1$, $E_2$ emit pulsed-light beams B1, B2, respectively. The timing with which light pulses are released from the pulsed-light source $E_1$ and the timing with which light pulses are released from the pulsed-light source $E_2$ are displaced relative to each other by the pulse-propagation controller 10. The beam splitter 1A essentially splits each pulsed-light beam B1, B2 into two sub-beams having half the energy but the same frequency as the corresponding pulsed-light beam. Two sub-beams, one from each pulsed-light beam, are integrated to produce two integrated light beams LB1 and LB2. The integrated light beams LB1, LB2 are supplied to the first exposure unit $L_1$ and the second exposure unit $L_2$, respectively. The integrated light beams LB1, LB2 each have a pulse frequency (number of pulses P in the beam per unit time) that is double the pulse frequency of either pulsed-light beam. The light pulses in each integrated light beam have a fluence F that is half the fluence of the pulses in either pulsed-light beam B1, B2. As a result, each integrated light beam LB1, LB2 reduces by half the effects of solarization and radiation compaction on the projection lenses used in the corresponding exposure units $L_1$, $L_2$.

Figure 5A:
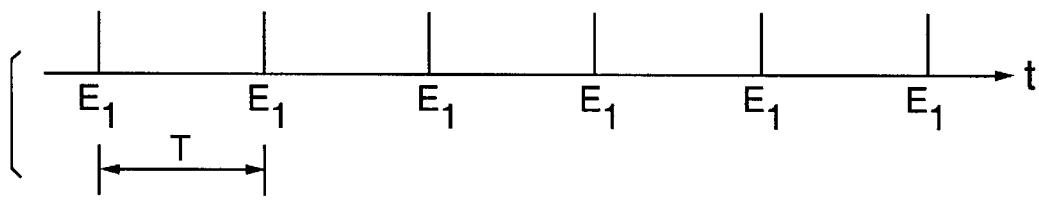
FIGS. 5(a) and 5(b) show a representative illumination-light pulse-timing scheme for the FIG. 1 embodiment.
Figure 5B:
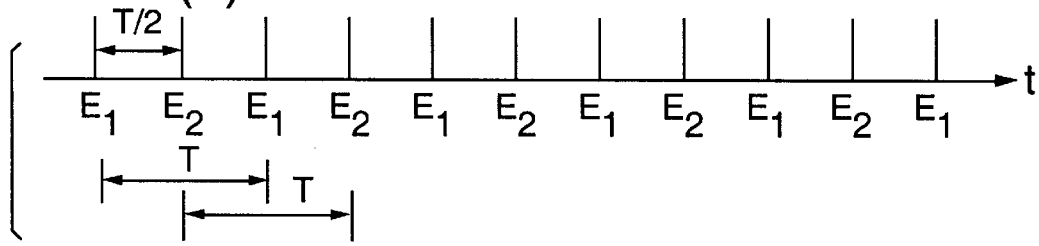
Figure 5C:
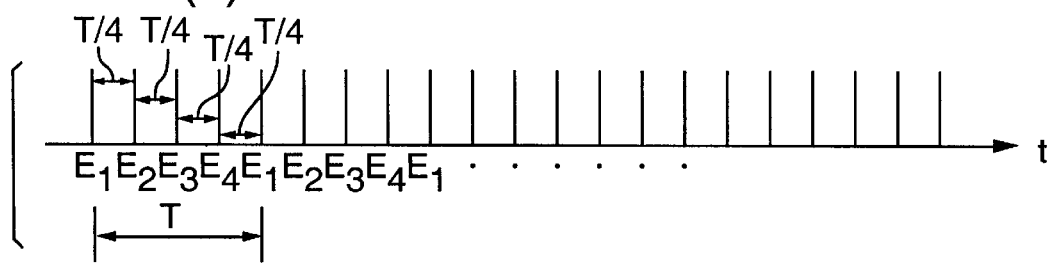

The foregoing doubling of the pulse frequency and halving of the fluence by integrating two pulsed-light beams is illustrated in the timing plots of FIGS. 5(a) and 5(b). FIG. 5(a) shows the pulse sequence for the first pulsed-light source $E_1$, and FIG. 5(b) shows the pulse sequence for both pulsed-light sources $E_1$, $E_2$. The horizontal axes of FIGS. 5(a)–5(c) are time t, and each vertical line extending from the time axis represents a separate pulse. The vertical lines are labeled as $E_1$ or $E_2$ to indicate the source of the pulse.

As shown in FIG. 5(b), the first pulsed-light source $E_1$ generates a first pulse train of light having a constant period T (all pulses are labeled $E_1$). Concurrently, a second pulse train of light is generated by the second pulsed-light source $E_2$ at a constant period T (all pulses are labeled $E_2$). The first pulse train is "phase-shifted" by T/2 relative to the second pulse train. As a result, the period of the integrated pulse trains is T/2 (FIG. 5(b)) rather than T. For example, if the pulse frequency of each pulsed-light source $E_1$, $E_2$ is 1 kHz, the pulse frequency of each integrated light beam LB1, LB2 supplied to the exposure units $L_1$, $L_2$, respectively, is 2 kHz.

As shown in FIG. 5(b), each pulse is preferably equally spaced on the time axis t. However, in general, such equal spacing is not necessary, so long as the pulses do not overlap each other. This applies with respect to any of the embodiments encompassed by this invention.

Therefore, in the FIG. 1 embodiment, it is possible to supply, from two 1-kHz pulsed-light sources, 2-kHz integrated light beams to each exposure unit $L_1$, $L_2$. Assuming that the same amount of irradiation energy is being supplied per unit time to each exposure unit $L_1$, $L_2$ as would be required if only a single pulsed-light source were to be used, since the number of light pulses being supplied to each exposure unit $L_1$, $L_2$ per unit time is now doubled, the amount of irradiation energy per light pulse can be reduced in half. Such reduction is accomplished in the FIG. 1 embodiment by passing the pulsed-light beams B1, B2 through the beam splitter 1A which equally "splits" each pulsed-light beam. Thus, half the irradiation energy from each pulsed-light beam propagates in one direction in the first integrated light beam LB1 and half in the other direction in the second integrated light beam. Each integrated light beam LB1, LB2 has twice the pulse frequency but half the energy per pulse as either of the source pulsed-light beams B1, B2, respectively.

As described above, at a given wavelength of light, both solarization and radiation compaction are proportional to $F^2 \cdot P$. With the FIG. 1 embodiment, the fluence F of each integrated light beam is half the initial fluence $F_0$ of each pulsed-light beam. If the pulse frequency of each pulsed-light beam is $P_0$, the effects on transmissivity and refractive index of the projection lenses used in the FIG.-1 embodiment due to solarization and radiation compaction are both reduced by half:

$$F^2 \cdot P = (F_0/2)^2 (2P_0) = F_0^2 \cdot (P_0/2)$$

Moreover, since the integrated light beam LB2 supplied to the second exposure unit $L_2$ is identical to the integrated light beam LB1 supplied to the first exposure unit $L_1$, the cost of each pulsed-light source per each exposure unit is advantageously the same as when a single pulsed-light source is used in two separate projection-exposure apparatus each having a single exposure unit.

The scheme described above can be generally extended to projection-exposure apparatus according to the present invention utilizing n (wherein n is an integer and $n \geq 2$) pulsed-light sources each producing a pulsed-light beam of the same frequency P. "Phase-shifting" each pulsed-light beam relative to the other pulsed-light beams and integrating the beams as described above yields integrated light beams each having a fluence of F/n and each having a pulse frequency of P·n. Where the pulse-propagation period for each pulsed-light source is T, each pulsed-light source is preferably phase-shifted by about T/n. By thus utilizing n pulsed-light sources each having a $F_0$ and a pulse frequency $P_0$, the resulting integrated light beams have an effect on transmissivity and refractive index due to solarization and radiation compaction of any respective lens through which the integrated beams pass that is reduced by 1/n:

$$F^2 \cdot P = (F_0/n)^2 (nP_0) = F_0^2 (P_0/n) \quad (1)$$

In other words, the usable life of the illumination lenses and projection lenses used in projection-exposure apparatus according to the present invention are extended by a factor of n.

Figure 2:
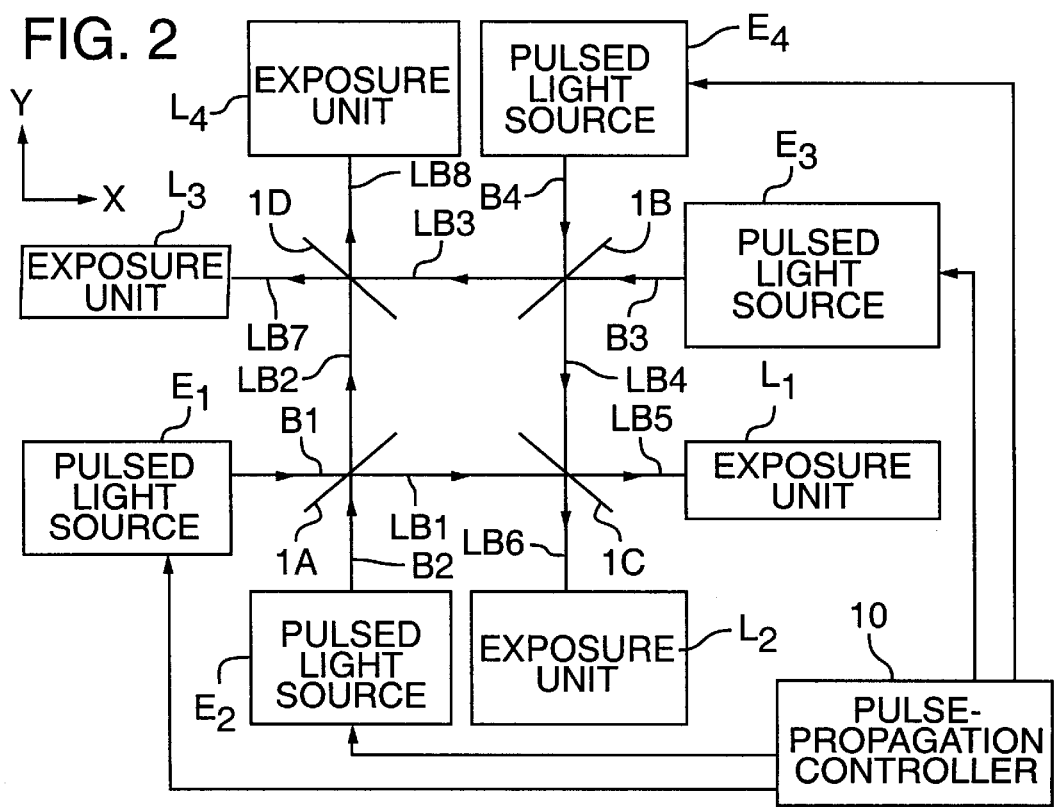
FIG. 2 is a schematic drawing illustrating an alternative embodiment employing four pulsed-light sources; the pulse trains of illumination light from all four pulsed-light sources are integrated and supplied to four separate exposure units.

We turn now to an example embodiment in which n=4, as shown in FIG. 2. Such an apparatus can be made by combining two apparatus of the type shown in FIG. 1, i.e., by placing additional beam splitters in the positions of the exposure units $L_1$ and $L_2$ in FIG. 1. As a result, four beam splitters 1A–1D are used in the FIG. 2 embodiment.

In FIG. 2, the four beam splitters 1A–1D are symmetrically arranged as shown. Each beam splitter 1A–1D is a so-called 50-percent transmitting, 50-percent reflecting beam splitter that transmits approximately half the energy of each incident pulsed-light beam and reflects the remaining energy. The pulsed-light beams B1, B2 from the first and second pulsed-light sources $E_1$, $E_2$, respectively, enter the beam splitter 1A from perpendicular directions. Each pulsed-light beam B1, B2 is thus split; half the energy from each pulsed-light beam B1, B2 is integrated together to produce the integrated light beams LB1 and LB2 each having twice the pulse frequency of the pulsed-light beams B1, B2. The integrated light beams LB1, LB2 enter beam splitters 1C, 1D, respectively. Meanwhile, the pulsed-light beams B3, B4 from the third and fourth pulsed-light sources $E_3$, $E_4$, respectively, enter the beam splitter 1B from perpendicular directions. Each pulsed-light beam B3, B4 is thus split; half the energy from each pulsed-light beam B3, B4 is integrated together to produce the integrated light beams LB3 and LB4 each having twice the pulse frequency of the pulsed-light beams B3, B4. The integrated light beams LB3, LB4 enter beam splitters 1D, 1C, respectively.

The integrated light beams LB1 and LB4 enter the beam splitter 1C from perpendicular directions; similarly, the integrated light beams LB2 and LB3 enter the beam splitter 1D from perpendicular directions. The integrated light beams LB1, LB4 are split by the beam splitter 1C to produce the integrated light beams LB5 and LB6 each integrated from half of each of the integrated light beams LB1, LB4. The integrated light beams LB5, LB6 are respectively supplied to the first and second exposure units $L_1$ and $L_2$. The integrated light beam LB1 contains half the energy of each of the pulsed-light beams B1 and B2, while the integrated light beam LB4 contains half the energy of each of the pulsed-light beams B3 and B4. Each of the integrated light beams LB1, LB4 has twice the pulse frequency of any one of the pulsed-light beams B1–B4. Consequently, the integrated light beams LB5 and LB6 each contain one-fourth the energy of each of the pulsed-light beams B1–B4 and 4× the pulse frequency of any one of the pulsed-light beams B1–B4.

Similarly, the integrated light beams LB2, LB3 are split by the beam splitter 1D to produce the integrated light beams LB7 and LB8 each integrated from half of each of the integrated light beams LB2 and LB4. The integrated light beams LB2, LB4 are respectively supplied to the third and fourth exposure units $L_3$, $L_4$. The integrated light beam LB2 contains half the energy of each of pulsed-light beams B1 and B2, while the integrated light beam LB3 contains half the energy of each of the pulsed-light beams B3 and B4. Each of the integrated light beams LB2, LB3 has twice the pulse frequency of any one of the pulsed-light beams B1–B4. Consequently, the integrated light beams LB7 and LB8 each contain one-fourth the energy of each of the pulsed-light beams B1–B4 and 4× the pulse frequency of any one of the pulsed-light beams B1–B4. Thus, in the FIG. 2 embodiment, integrated light beams containing a one-fourth energy contribution from each of the pulsed-light beams from the four pulsed-light sources $E_1$–$E_4$ is supplied to each of the four exposure units $L_1$–$L_4$.

The light-pulse trains from the four pulsed-light sources $E_1$–$E_4$ are controlled so that the pulse trains are "phase-shifted" T/4 relative to each other by the pulse-propagation controller 10, as shown in FIG. 5(c) compared to FIG. 5(a). (In FIG. 5(c), T is the pulse-propagation period of any one of the pulsed-light beams B1–B4.) According to Equation (1), the initial value of $F^2 \cdot P$ is reduced to one-fourth for each exposure unit L1–L4, and the effects of solarization and radiation compaction on each exposure unit are correspondingly reduced to one-fourth relative to a conventional projection-exposure apparatus employing only one pulsed-light source.

Figure 3:
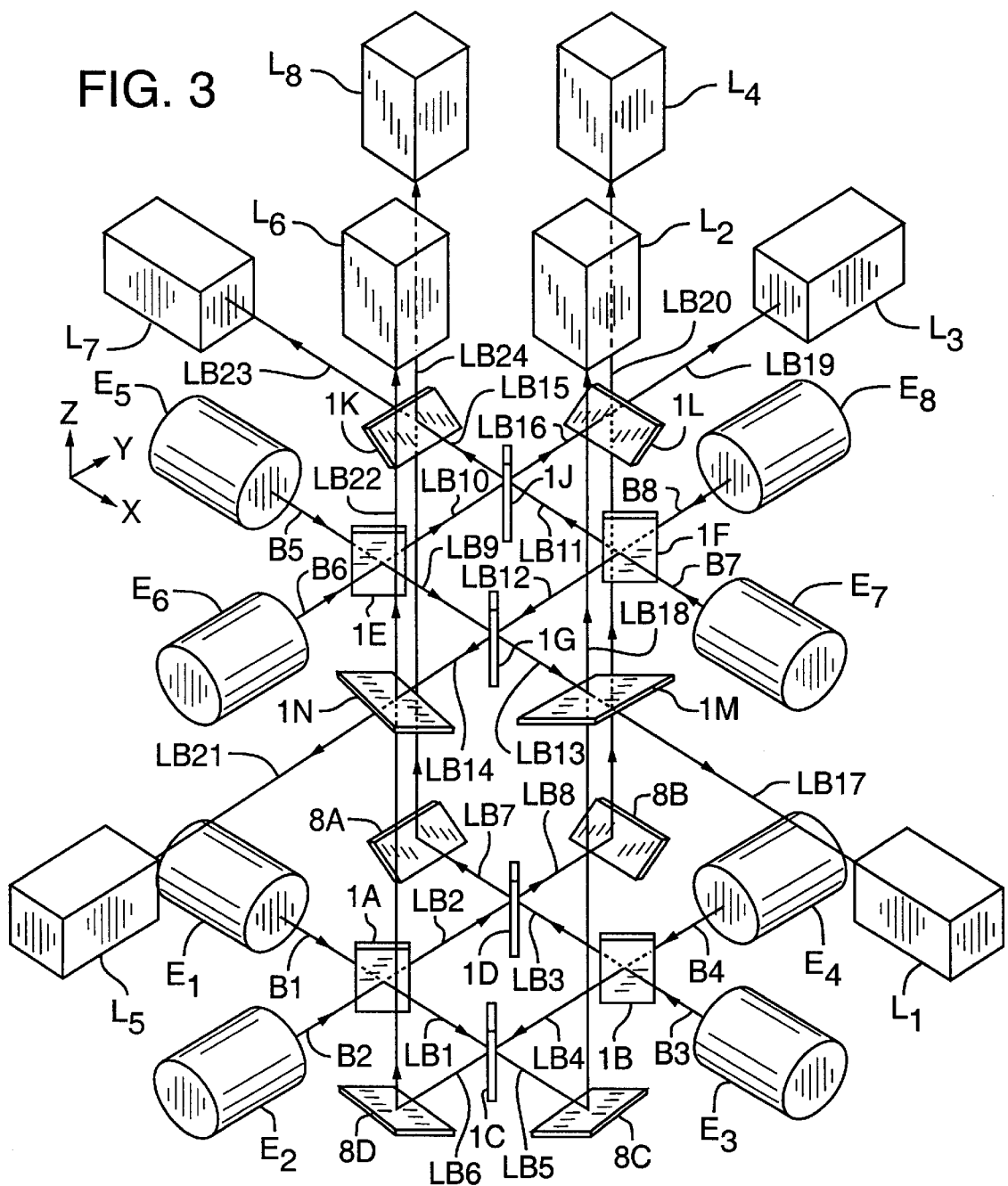
FIG. 3 is a schematic drawing illustrating another alternative embodiment employing eight pulsed-light sources; the pulse trains of illumination light from all eight pulsed-light sources are integrated and supplied to eight separate exposure units.

FIG. 3 pertains to an example embodiment comprising eight pulsed-light sources. At a "lower" level in FIG. 3, fully reflecting mirrors 8A–8D are situated in place of the four exposure units $L_1$–$L_4$ in FIG. 2. At an "upper" level in FIG. 3, half-mirrors 1K–1N are situated in place of the exposure device units $L_1 L_4$ in FIG. 2. Thus, a three-dimensional arrangement of mirrors is defined in FIG. 3.

Further with respect to FIG. 3, descriptions of the light paths assumed by the pulsed-light beams propagating from the pulsed-light sources $E_1$–$E_4$ on the lower level and the processes of splitting and integrating the pulsed-light beams by the beam splitters 1A–1D are not provided because such descriptions are similar to the foregoing descriptions pertaining to FIG. 2. Propagation of light is explained below starting with the light beams reflected from the fully reflective mirrors 8A–8D.

As shown in FIG. 3, four additional pulsed-light sources $E_5$–$E_8$ are situated in the upper level. The pulsed-light beams B5, B6 emitted from the fifth and sixth pulsed-light sources $E_5$, $E_6$, respectively, enter the beam splitter 1E from perpendicular directions. The pulsed-light beams B5 and B6 are each split by the beam splitter 1E to produce two integrated light beams LB9 and LB10 each containing half the energy of each of pulsed-light beams B5 and B6. The integrated light beams LB9, LB10 enter beam splitters 1G and 1J, respectively. Similarly, the pulsed-light beams B7, B8 emitted from the seventh and eighth pulsed-light sources $E_7$, $E_8$ enter the beam splitter 1F from perpendicular directions. The pulsed-light beams B7 and B8 are each split by the beam splitter 1F to produce two integrated light beams LB11 and LB12 each containing half the energy of each of pulsed-light beams B7 and B8. The integrated light beams LB11, LB12 enter beam splitters 1J and 1G, respectively.

At the beam splitter 1G, integrated light beams LB9 and LB12 enter from perpendicular directions; similarly, at the beam splitter 1J, integrated light beams LB10 and LB11 enter from perpendicular directions. The integrated light beams LB9, LB12 are each split by the beam splitter 1G and integrated to produce the integrated light beams LB13 and LB14, which enter the beam splitters 1M and 1N, respectively. Meanwhile, the integrated light beams LB10 and LB11, which enter the beam splitter 1J from perpendicular directions, are each split by the beam splitter 1J and integrated to produce the integrated light beams LB15 and LB16, which enter the beam splitters 1K and 1L, respectively.

Returning now to the lower level shown in FIG. 3, the integrated light beam LB5 produced by the beam splitter 1C is reflected upward by the mirror 8C to the beam splitter 1M. At the beam splitter 1M, the integrated light beam LB13, produced by the beam splitter 1G, enters parallel with the XY plane. The beam splitter 1M splits and integrates the integrated light beams LB5 and LB13, which enter from perpendicular directions to produce integrated light beams LB17 and LB18 which are respectively supplied to the exposure units $L_1$ and $L_2$.

The other mirrors 8A, 8B, 8D are similar to and function in the same manner as the mirror 8C described above. Integrated light beams LB7, LB8, LB6 are reflected upward by the mirrors 8A, 8B, 8D and enter beam splitters 1K, 1L, 1N, respectively. The integrated light beams LB7 and LB15 enter the beam splitter 1K, and the integrated light beams LB8 and LB16 enter the beam splitter 1L. In addition, the integrated light beams LB6 and LB14 enter the beam splitter 1N. The various integrated light beams incident to beam splitters 1K, 1L, 1N are similarly split and integrated to form integrated light beams LB23 and LB24, LB19 and LB20, and LB21 and LB22, respectively, which are respectively supplied to the exposure units $L_7$, $L_8$, $L_3$, $L_4$, $L_5$, $L_6$.

In FIG. 3, the integrated light beam LB5 contains a one-fourth energy contribution from each of the pulsed-light beams B1–B4 emitted from the pulsed-light sources $E_1$–$E_4$, respectively. Similarly, the integrated light beam LB13 contains a one-fourth energy contribution from each of the pulsed-light beams B5–B8 emitted from the pulsed-light sources $E_5$–$E_8$, respectively. Integrated light beams LB17 (integrated from beams LB5 and LB13) and LB18 (integrated from beams LB5 and LB13), each of which containing a one-eighth energy contribution from each of the pulsed-light beams B1–B8 respectively emitted from the pulsed-light sources $E_1$–$E_8$ are supplied to the exposure units $L_1$ and $L_2$, respectively. Similar integration schemes are used to supply integrated light beams to the other six exposure units $L_3$–$L_8$.

The light-pulse trains from the eight pulsed-light sources $E_1$–$E_8$ are controlled by a pulse-propagation controller (not shown) so that each is phase-shifted by T/8 relative to the other pulse trains, where T is the pulse-propagation period from any one pulsed-light source. Thus, integrated light beams, each with a pulse frequency that is eight-fold greater than the pulse frequency of any single pulsed-light source, are supplied to each of the eight exposure units $L_1$–$L_8$. According to Equation (1), the initial value for $F^2 \cdot P$ is reduced to one-eighth, and the effects of solarization and radiation compaction on the exposure units are reduced to one-eighth compared to when only a single pulsed-light source is used.

Figure 4:
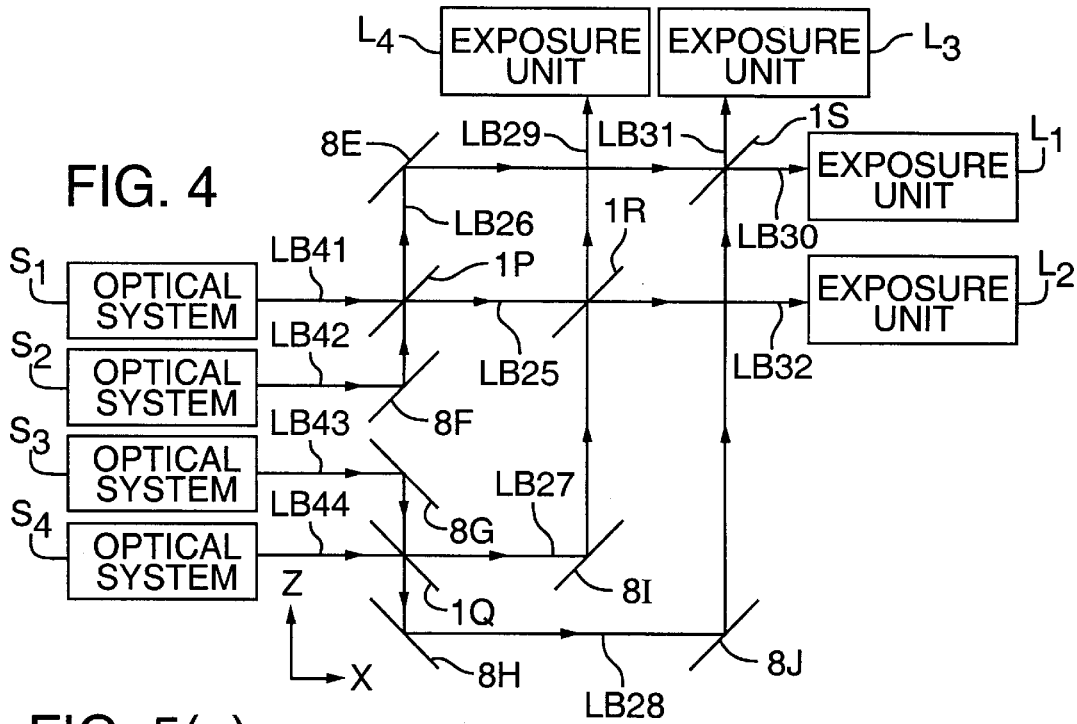
FIG. 4 is a schematic drawing illustrating yet another alternative embodiment employing sixteen pulsed-light sources; the pulse trains of illumination light from all sixteen pulsed-light sources are integrated and supplied to sixteen separate exposure units.

FIG. 4 illustrates an example portion of an embodiment of an apparatus according to the present invention in which an integrated light beam having a 16-fold greater pulse frequency (compared to light emitted by a single pulsed-light source) is supplied to 16 exposure units. Sixteen pulsed-light sources are employed. In an actual apparatus, four portions shown in FIG. 4 would be used, the portions being stacked in four "layers" in the Z dimension of FIG. 3. In FIG. 4, the optical systems for each such layer are denoted by optical systems $S_1$–$S_4$, respectively. The trajectories of the light beams in this example embodiment are complicated, but by arranging in each layer six fully reflective mirrors 8E–8J and four "half mirrors" (50% transmitting, 50% reflecting) 1P–1S, integrated light beams each having 16-fold greater pulse frequency than that of a single pulsed-light source can be supplied to each of four exposure units $L_1$–$L_4$. In FIG. 4, only one layer is shown; but since the same configuration is used for each of the four layers, integrated light beams each uniformly containing light pulses from a total of 16 individual pulsed-light sources can be supplied to each of 16 exposure units.

In FIG. 4, four pulsed-light sources are situated in each of the optical systems $S_1$–$S_4$ that supply integrated light beams LB41–LB44, respectively. Each of the integrated light beams LB41–LB44 contains a one-fourth energy contribution from each of the four pulsed-light beams produced by the four pulsed-light sources, respectively. The integrated light beam LB41 from the optical system $S_1$ is split by the beam splitter 1P. The integrated light beam LB42 from the optical system $S_2$ and reflected by the mirror 8F enters the beam splitter 1P from a direction perpendicular to that of the integrated light beam LB41. Both integrated light beams are split and integrated by the beam splitter 1P. The two integrated light beams LB25 and LB26 produced by the beam splitter 1P, propagate in perpendicular directions. One integrated light beam LB25 enters the beam splitter 1R. The other integrated light beam LB26 is reflected by the mirror 8E and enters the beam splitter 1S. Similarly, the integrated light beam LB43 from optical system $S_3$ is reflected by the mirror 8G. The integrated light beam LB43 then enters the beam splitter 1Q, and is split. The integrated light beam LB44 emitted by the optical system $S_4$ enters the beam splitter 1Q from a direction perpendicular to that of the integrated light beam LB43, and is similarly split by the beam splitter 1Q. The beam splitter 1Q produces integrated light beams LB27 and LB28 by integrating the integrated light beams LB43, LB44. The beams LB27, LB28 exit the beam splitter 1Q in perpendicular directions. The integrated light beam LB27 is reflected by the mirror 8I and enters the beam splitter 1R. The other integrated light beam LB28 is reflected by the mirrors 8H and 8J and enters the beam splitter 1S.

The beam splitter 1R splits and integrates the integrated light beams LB25 and LB27 to produce the two integrated light beams LB29 and LB32, each being integrated to contain half of the energy of each of the integrated light beams LB25, LB27. The beams LB29, LB32 propagate in perpendicular directions and are respectively supplied to the exposure units $L_4$, $L_2$. Meanwhile, the integrated light beams LB26 and LB28, entering the beam splitter 1S from perpendicular directions, are each split and integrated by the beam splitter 1S to produce the two integrated light beams LB30 and LB31. Each beam LB30, LB31 contains a half energy contribution from each of the integrated light beams LB26, LB28. The beams LB30, LB31 propagate in perpendicular directions and are respectively supplied to the exposure units $L_1$, $L_3$. Thus, integrated light beams each containing a one-fourth energy contribution from each of the integrated light beams LB41–LB44 from optical systems $S_1$–$S_4$ are supplied to the four exposure units $L_1$–$L_4$, respectively. Each beam LB41–LB44 contains a one-fourth energy contribution from each of the pulsed-light beams respectively emitted from the four pulsed-light sources. Consequently, the integrated light beams supplied to the four exposure device units $L_1$–$L_4$ each contain a ¹⁄₁₆ energy contribution from each of the pulsed-light beams emitted from the 16 individual pulsed-light sources.

Each of the light-pulse trains produced by the 16 pulsed-light sources is phase-shifted relative to any of the others by T/16, where T is the propagation period of the pulsed light produced by any one of the pulsed-light sources. Thus, an integrated light beam having a pulse frequency 16-fold higher than the pulse frequency of any one pulsed-light source is supplied to each exposure unit $L_1$–$L_4$ and to each of the other twelve exposure units in this embodiment.

With the example embodiment of FIG. 4, the effects of solarization and radiation compaction are reduced to one-sixteenth according to Equation (1).

Referring further to FIG. 4, if one were to construct, on an XY coordinate system in place of the XZ coordinate system, the four pulsed-light sources $E_1$–$E_4$ arranged in place of the four optical systems $S_1$–$S_4$ as the optical system $S_1$, the pulsed-light sources could be collectively arranged, thereby making it possible to have the overall apparatus be more compact.

Yet another alternative embodiment of an apparatus according to this invention is shown in FIG. 6. In the FIG. 6 embodiment, pulsed-light beams B1, B2 from two pulsed-light sources $E_1$, $E_2$, respectively, are integrated and supplied to a single exposure unit $L_1$. The construction of the pulsed-light sources $E_1$, $E_2$ and of the exposure unit $L_1$ are the same as in the FIG. 1 embodiment. In FIG. 6, elements corresponding to similar elements as shown in FIG. 1 have the same reference designators, and any further detailed description concerning those elements is not provided.

Further with respect to FIG. 6, the pulsed-light beams B1, B2 respectively emitted from the pulsed-light sources $E_1$, $E_2$ enter a polarized beam splitter 21 from perpendicular directions. The polarized beam splitter 21 is oriented at about a 45° angle to the trajectories of the pulsed-light beams B1, B2. The polarized beam splitter 21 reflects "s" polarized light and transmits "p" polarized light. The beams B1, B2 both have "p" polarity; thus, both beams pass through the polarized beam splitter 21. The pulsed-light beam B2, after passing through the polarized beam splitter 21, is converted to circularly polarized light by a ¼-wavelength plate 22 and is incident normally to a mirror 23. The pulsed-light beam B2 is reflected normally by the mirror 23 and becomes inverted circularly polarized light; the beam B2 returns along the same trajectory and again passes through the ¼-wavelength plate 22 to be converted to "s" polarized light. The beam B2 again enters the polarized beam splitter 21 which reflects the beam and integrates it with the beam B1 that passed through the polarized beam splitter 21. The resulting integrated beam B3 is supplied to the exposure unit $L_1$.

The two pulsed-light sources $E_1$, $E_2$ are controlled by a pulse-propagation controller (not shown) in the same way as in the FIG. 1 embodiment to cause them to be "phase shifted" as described above. This ensures that the integrated light beam B3 has a pulse frequency that is twice the pulse frequency of light from either of the pulsed-light sources $E_1$, $E_2$. Consequently, the amount of irradiation energy per pulse of light in the beam B3 that is supplied to the exposure unit $L_1$ can be reduced by half. This enables the effects of solarization and radiation compaction on the projection lenses in the exposure unit $L_1$ to be reduced by half, as in the FIG. 1 embodiment.

In addition, in this example embodiment, since all the light energy emitted from the two pulsed-light sources $E_1$, $E_2$ is supplied to only one exposure unit $L_1$, if the same throughput as when a single pulsed-light source is acceptable, then the energy output of the two pulsed-light sources $E_1$, $E_2$ can be reduced by half.

In the FIG. 6 embodiment, the number of pulsed-light sources is not limited to two. Three or more pulsed-light sources can be similarly assembled to supply one exposure unit.

For example, in FIG. 6, if another polarized beam splitter were situated in the light path of the integrated light beam B3 between the polarized beam splitter 21 and the exposure device unit $L_1$, and if an optical system were arranged with the same configuration as the pulsed-light source $E_2$, quarter-wavelength plate 22, and mirror 23 in FIG. 6 in the direction perpendicular to the light path of the beam B3, an integrated light beam with a tripled pulse frequency could be supplied to a single exposure unit from three pulsed-light sources. An apparatus with four or more pulsed-light sources can be similarly constructed.

Yet another example embodiment is shown in FIGS. 7(a)–7(b). In this example, a resolution-enhancing light source is employed in which the distribution of light flux in the pupil plane of the illumination optical system is maximized at multiple locations that are off-center from the optical axis AX of the illumination optical system. The illumination light flux illuminates the reticle pattern slanted by a desired angle. Such resolution enhancement is effective for, e.g., increasing the depth of focus at the periphery of the projected pattern.

Those features of the FIG. 7 embodiment that are similar to corresponding features in the FIG. 1 embodiment have the same reference designators and are not described further.

FIG. 7(a) shows the general construction of the projection-exposure apparatus of this example, and FIG. 7(b) shows the arrangement of the illumination light sources in the pupil plane P of the illumination optical system 2A. In FIG. 7(a), the pulsed-light sources $E_2$, $E_4$ and the pulsed-light beams B2, B4 are shown in superposed relationship. The pulsed-light beams B1–B4 emitted from the pulsed-light sources $E_1$–$E_4$ illuminate the reticle 3 at a slant relative to the illumination optical system 2A. The image of the reticle pattern is thus transferred through the projection optical system 5 onto the wafer 6, based on the slanted illumination by the pulsed-light beams B1–B4.

As shown in FIG. 7(b), the pulsed-light beams B1–B4 form four light-source images that are off-center at positions equidistant from the optical axis AX of the illumination optical system 2A and at equiangular spacing around the periphery of the pupil plane P, forming a so-called "resolution-enhancing" light source. The light pulse trains in the beams B1–B4 are controlled by the pulse-propagation controller 10 so as to be T/4 phase-shifted relative to one another. Thus the illumination optical system 2A essentially acts as an integrated optical system. Consequently, the pulse frequency of the light passing through the reticle 3 is four times the pulse frequency of the light produced by any one of the pulsed-light sources $E_1$–$E_4$. Under such conditions, if the same throughput is acceptable, the light energy in any one beam B1–B4 can be reduced to one-fourth. Thus, the effects of solarization and radiation compaction can be reduced to one-fourth while increasing resolution.

In FIG. 7(a), integrated pulsed-light sources similar to those used in the FIG. 2 embodiment can be used in place of the pulsed-light beams B1–B4 from pulsed-light sources $E_1$–$E_4$.

Apparatus according to the present invention are not limited to stepper-type projection-exposure apparatus. The principles of this invention can similarly be applied to scanning-exposure-type apparatus in general, e.g., "step-and-scan" systems in which the patterns on a reticle are gradually transferred and exposed to respective transfer fields on a wafer by synchronously scanning the reticle and the wafer.

Therefore, apparatus according to this invention allow integrated pulsatile light from multiple pulsed-light sources to be supplied to each of one or more exposure units. Since the pulse frequency of the integrated light increases in proportion to the number of multiple pulsed-light sources that are employed, in cases where the same throughput is to be achieved as when a single pulsed-light source is used, the density of the irradiation energy (light intensity) per pulse of integrated light supplied to the exposure unit can be decreased in inverse proportion to the number of pulsed-light sources. Since the effects of solarization and radiation compaction on the lenses used in the exposure unit are proportional to the square of the irradiation energy density per pulse of light at a given wavelength, the present invention advantageously achieves a substantial reduction in the rate of degradation of transmissivity and refractive index of lenses used in the exposure unit. This lengthens the life of the lenses, even when pulsed-light sources such as KrF excimer lasers or ArF excimer lasers, etc., are used to provide the illumination light.

In apparatus according to the present invention, a pulse-propagation controller is preferably utilized that controls the relative phase of the various light-beam pulse trains being emitted from the multiple pulsed-light sources. This prevents overlap of successive pulses provided to the exposure unit(s) and allows the illumination light irradiation energy supplied to the exposure unit(s) to be made essentially uniform with respect to time.

Whereas the invention has been described in connection with various example embodiments, the invention is not limited to those example embodiments. On the contrary, the invention is intended to encompass all alternatives, modifications, and equivalents as may be included within the spirit and scope of the invention as defined by the appended claims.

What is claimed is:

1. A projection-exposure apparatus, comprising:
    (a) multiple pulsed-light sources each operable to produce a pulsed-light beam comprising a light pulse train having a pulse frequency $P_0$, each pulse train being phase-shifted relative to one another such that no light pulse from any of the pulsed-light sources occurs at a same instant of time as a light pulse from any other of the pulsed-light sources;
    (b) a stationary integration optical system operable to receive and integrate the pulsed-light beams from each of the pulsed-light sources to produce at least a first integrated light beam having a pulse frequency of $P_0$ times the number of pulsed-light sources, the integration optical system being operable to integrate the pulsed-light beams in association with the pulsed-light sources; and
    (c) a first exposure unit situated so as to receive the first integrated light beam from the integration optical system, the first exposure unit being operable to utilize the first integrated light beam for projection exposure of a pattern defined by a first reticle onto a surface of a first photosensitive substrate.

2. The projection-exposure apparatus of claim 1, further comprising a pulse-propagation controller connected to each pulsed-light source, the pulse-propagation controller being operable to phase-shift the light-pulse train from each pulsed-light source.

3. The projection-exposure apparatus of claim 1, further comprising a second exposure unit operable to receive a second integrated light beam from the integration optical system, the second exposure unit being operable to utilize the second integrated light beam for projection exposure of a pattern defined by a second reticle onto a surface of a second photosensitive substrate.

4. The projection-exposure apparatus of claim 3, wherein the integration optical system comprises a beam splitter operable to direct the first integrated light beam to the first exposure unit and the second integrated light beam to the second exposure unit.

5. The projection-exposure apparatus of claim 4, wherein each of the first and second exposure units comprises an illumination optical system and a projection optical system.

6. The projection-exposure apparatus of claim 1, wherein the first exposure unit comprises an illumination optical system and a projection optical system.

7. The projection-exposure apparatus of claim 1, wherein each of the pulsed-light sources is a pulsed laser.

8. The projection-exposure apparatus of claim 7, wherein each of the pulsed-light sources is an excimer laser.

9. The projection-exposure apparatus of claim 1, wherein the integration optical system comprises a polarized beam splitter.

10. The projection-exposure apparatus of claim 1 that is a stepper.

11. A method for performing projection-exposure of a pattern defined by a reticle onto a photosensitive surface of a substrate, the method comprising the steps:
    (a) providing multiple pulsed-light beams each comprising a light pulse train having a pulse frequency $P_0$;
    (b) phase-shifting the pulsed-light beams relative to one another such that no light pulse in any of the pulsed-light beams occurs at a same instant of time as a light pulse from any other of the pulsed-light beams;
    (c) using a stationary integration optical system integrating the pulsed-light beams to produce at least a first integrated light beam having a pulse frequency of $P_0$ times the number of pulsed-light beams that are integrated by the integration optical system; and
    (d) propagating the first integrated light beam through a first exposure unit in which the integrated light beam passes through a reticle, defining the pattern, onto a photosensitive surface of a substrate.

12. The method of claim 11, wherein, in step (c), the first integrated light beam is produced to comprises pulses each having an energy level equal to the energy level of a pulse of any of the pulsed-light beams divided by the number of pulsed-light beams that are integrated.

13. The method of claim 11, wherein step (c) comprises integrating the pulsed-light beams to produce first and second integrated light beams each having a pulse frequency of $P_0$ times the number of pulsed-light beams that are integrated.

14. In a projection-exposure method in which a pulsed-light beam is passed through a reticle so as to form an image, by projection, defined by the reticle onto a surface of a substrate, an improvement comprising:
  (a) providing multiple pulsed-light beams each comprising a light pulse train having a pulse frequency $P_0$;
  (b) phase-shifting the pulsed-light beams relative to one another such that no light pulse in any of the pulsed-light beams occurs at a same instant of time as a light pulse from any other of the pulsed-light beams;
  (c) using a stationary integration optical system, integrating the pulsed-light beams to produce an integrated light beam having a pulse frequency of $P_0$ times the number of pulsed-light beams that are integrated by the integration optical system; and
  (d) using the integrated light beam to perform projection-exposure of the pattern onto the surface of the substrate.

15. In a projection-exposure method in which a pulsed-light beam is passed through an exposure unit including an illumination optical system, a reticle defining a pattern, and a projection optical system so as to form an image of the pattern on a surface of a substrate, an improvement serving to reduce rates of solarization and radiation compaction of the exposure unit, the improvement comprising:
  (a) providing multiple pulsed-light beams each having a fluence $F_0$ and each comprising a light pulse train having a pulse frequency $P_0$;
  (b) phase-shifting the pulsed-light beams relative to one another such that no light pulse in any of the pulsed-light beams occurs at a same instant of time as a light pulse from any other of the pulsed-light beams;
  (c) integrating the pulsed-light beams to produce an integrated light beam having a pulse frequency of $P_0$ times the number of pulsed-light beams that are integrated, each pulsed-light beam having a fluence equal to $F_0$ divided by the number of pulsed-light beams that are integrated; and
  (d) passing the integrated light beam through the exposure unit to perform projection-exposure of the pattern onto the surface of the substrate.

16. A method for fabricating a device such as a semiconductor device, liquid-crystal display, image pick-up element, or thin-film magnetic head, the method comprising the steps:
  (a) providing a projection-exposure apparatus, comprising (i) multiple pulsed-light sources each operable to produce a pulsed-light beam comprising a light pulse train having a pulse frequency $P_0$, each pulse train being phase-shifted relative to one another such that no light pulse from any of the pulsed-light sources occurs at a same instant of time as a light pulse from any other of the pulsed-light sources; (ii) a stationary integration optical system operable to receive and integrate the pulsed-light beams from each of the pulsed-light sources to produce at least a first integrated light beam having a pulse frequency of $P_0$ times the number of pulsed-light sources, the integration optical system being operable to integrate the pulsed-light beams in association with the pulsed-light sources; and (iii) a first exposure unit situated so as to receive the first integrated light beam from the integration optical system, the first exposure unit being operable to utilize the first integrated light beam for projection-exposure of a pattern defined by a first reticle onto a surface of a first photosensitive substrate;
  (b) with the first integrated light beam, illuminating the pattern defined by the first reticle; and
  (c) using the first exposure unit, projection-exposing the pattern defined by the first reticle onto the surface of the first photosensitive substrate.

17. A method for fabricating a device such as a semiconductor device, liquid-crystal display, image pick-up element, or thin-film magnetic head, the method comprising the steps:
  (a) providing a projection-exposure apparatus, comprising (i) multiple pulsed-light sources each operable to produce a pulsed-light beam comprising a light pulse train having a pulse frequency $P_0$, each pulse train being phase-shifted relative to one another such that no light pulse from any of the pulsed-light sources occurs at a same instant of time as a light pulse from any other of the pulsed-light sources; (ii) an integration optical system operable to receive and integrate the pulsed-light beams from each of the pulsed-light sources to produce at least a first integrated light beam having a pulse frequency of $P_0$ times the number of pulsed-light sources; (iii) a first exposure unit situated so as to receive the first integrated light beam from the integration optical system, the first exposure unit being operable to utilize the first integrated light beam for projection-exposure of a pattern defined by a first reticle onto a surface of a first photosensitive substrate; and (iv) a pulse-propagation controller connected to each pulsed-light source, the pulse-propagation controller being operable to phase-shift the light-pulse train from each pulsed-light source;
  (b) with the first integrated light beam, illuminating the pattern defined by the first reticle; and
  (c) using the first exposure unit, projection-exposing the pattern defined by the first reticle onto the surface of the first photosensitive substrate.

18. A method for fabricating a device such as a semiconductor device, liquid-crystal display, image pick-up element, or thin-film magnetic head, the method comprising the steps:
  (a) providing a projection-exposure apparatus, comprising (i) multiple pulsed-light sources each operable to produce a pulsed-light beam comprising a light pulse train having a pulse frequency $P_0$, each pulse train being phase-shifted relative to one another such that no light pulse from any of the pulsed-light sources occurs at a same instant of time as a light pulse from any other of the pulsed-light sources; (ii) an integration optical system operable to receive and integrate the pulsed-light beams from each of the pulsed-light sources to produce at least a first integrated light beam having a pulse frequency of $P_0$ times the number of pulsed-light sources; (iii) a first exposure unit situated so as to receive the first integrated light beam from the integration optical system, the first exposure unit being operable to utilize the first integrated light beam for projection-exposure of a pattern defined by a first reticle onto a surface of a first photosensitive substrate; and (iv) a second exposure unit operable to receive a second integrated light beam from the integration optical system, the second exposure unit being operable to utilize the second integrated light beam for projection-exposure of a pattern defined by a second reticle onto a surface of a second photosensitive substrate;

(b) with the first integrated light beam, illuminating the pattern defined by the first reticle;

(c) using the first exposure unit, exposing the pattern defined by the first reticle onto the surface of the first photosensitive substrate;

(d) with the second integrated light beam, illuminating the pattern defined by the second reticle; and (e) using the second exposure unit, exposing the pattern defined by the second reticle onto the surface of the second photosensitive substrate.

19. A method for fabricating a device such as a semiconductor device, liquid-crystal display, image pick-up element, or thin-film magnetic head, the method comprising the steps:

(a) providing a projection-exposure apparatus, comprising (i) multiple pulsed-light sources each operable to produce a pulsed-light beam comprising a light pulse train having a pulse frequency $P_0$, each pulse train being phase-shifted relative to one another such that no light pulse from any of the pulsed-light sources occurs at a same instant of time as a light pulse from any other of the pulsed-light sources; (ii) an integration optical system operable to receive and integrate the pulsed-light beams from each of the pulsed-light sources to produce at least a first integrated light beam having a pulse frequency of $P_0$ times the number of pulsed-light sources; (iii) a first exposure unit situated so as to receive the first integrated light beam from the integration optical system, the first exposure unit being operable to utilize the first integrated light beam for projection-exposure of a pattern defined by a first reticle onto a surface of a first photosensitive substrate; (iv) a second exposure unit operable to receive a second integrated light beam from the integration optical system, the second exposure unit being operable to utilize the second integrated light beam for projection-exposure of a pattern defined by a second reticle onto a surface of a second photosensitive substrate; and (v) the integration optical system comprising a beam splitter operable to direct the first integrated light beam to the first exposure unit and the second integrated light beam to the second exposure unit;

(b) with the first integrated light beam, illuminating the pattern defined by the first reticle;

(c) using the first exposure unit, exposing the pattern defined by the first reticle onto the surface of the first photosensitive substrate;

(d) with the second integrated light beam, illuminating the pattern defined by the second reticle; and (e) using the second exposure unit, exposing the pattern defined by the second reticle onto the surface of the second photosensitive substrate.

20. A method for fabricating a device such as a semiconductor device, liquid-crystal display, image pick-up element, or thin-film magnetic head, the method comprising the steps:

(a) providing a projection-exposure apparatus, comprising (i) multiple pulsed-light sources each operable to produce a pulsed-light beam comprising a light pulse train having a pulse frequency $P_0$, each pulse train being phase-shifted relative to one another such that no light pulse from any of the pulsed-light sources occurs at a same instant of time as a light pulse from any other of the pulsed-light sources; (ii) an integration optical system operable to receive and integrate the pulsed-light beams from each of the pulsed-light sources to produce at least a first integrated light beam having a pulse frequency of $P_0$ times the number of pulsed-light sources; (iii) a first exposure unit situated so as to receive the first integrated light beam from the integration optical system, the first exposure unit being operable to utilize the first integrated light beam for projection-exposure of a pattern defined by a first reticle onto a surface of a first photosensitive substrate; (iv) a second exposure unit operable to receive a second integrated light beam from the integration optical system, the second exposure unit being operable to utilize the second integrated light beam for projection-exposure of a pattern defined by a second reticle onto a surface of a second photosensitive substrate; and (v) the integration optical system comprising a beam splitter operable to direct the first integrated light beam to the first exposure unit and the second integrated light beam to the second exposure unit, and each of the first and second exposure units comprising an illumination optical system and a projection optical system;

(b) with the first integrated light beam, illuminating the pattern defined by the first reticle;

(c) using the first projection optical system, projecting an image of the pattern defined by the first reticle onto the surface of the first photosensitive substrate;

(d) with the second integrated light beam, illuminating the pattern defined by the second reticle; and (e) using the second projection optical system, projecting an image of the pattern defined by the second reticle onto the surface of the second photosensitive substrate.

* * * * *